(12) United States Patent
Chen

(10) Patent No.: US 11,675,541 B2
(45) Date of Patent: Jun. 13, 2023

(54) SYSTEMS AND METHODS FOR CENTRALIZED ADDRESS CAPTURE CIRCUITRY

(71) Applicant: Micron Technology, Inc., Boise, ID (US)

(72) Inventor: Liang Chen, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 43 days.

(21) Appl. No.: 17/506,472

(22) Filed: Oct. 20, 2021

(65) Prior Publication Data
US 2023/0124182 A1  Apr. 20, 2023

(51) Int. Cl.
*G06F 3/06* (2006.01)
*G11C 11/409* (2006.01)
*G11C 11/4093* (2006.01)

(52) U.S. Cl.
CPC .......... *G06F 3/0659* (2013.01); *G11C 11/409* (2013.01); *G11C 11/4093* (2013.01)

(58) Field of Classification Search
CPC .. G06F 3/0659; G11C 11/409; G11C 11/4093

USPC .................................................. 365/185.05
See application file for complete search history.

(56) References Cited

U.S. PATENT DOCUMENTS

| 2007/0245036 A1* | 10/2007 | Fekih-Romdhane ....................... G11C 7/1078 710/5 |
| 2019/0164583 A1* | 5/2019 | Penney ............... G11C 11/4076 |
| 2020/0210077 A1* | 7/2020 | Keeth ................... G06F 3/0673 |

* cited by examiner

*Primary Examiner* — Anthan Tran
(74) *Attorney, Agent, or Firm* — Fletcher Yoder, P.C.

(57) ABSTRACT

A memory device includes a command interface configured to receive a command from a host device via multiple command address bits. The memory device also includes a centralized command decoder configured to receive the command and to determine whether the command matches a bit pattern corresponding to multiple command types, such as a write command and a read command. The centralized command decoder is also configured to, in response to the command matching the bit pattern, asserting a latch signal. The memory device also includes a latch configured to capture the multiple command address bits based at least in part on assertion of the latch signal.

20 Claims, 4 Drawing Sheets

| | CS_n | CA 0 | CA 1 | CA 2 | CA 3 | CA 4 | CA 5 | CA 6 | CA 7 | CA 8 | CA 9 | CA 10 |
|---|---|---|---|---|---|---|---|---|---|---|---|---|
| WRITE COMMAND | L | H | L | H | H | L | N/A | BA 0 | BA 1 | BG 0 | BG 1 | BG 2 |
| | H | C2 | C3 | C4 | C5 | C6 | C7 | C8 | C9 | X10 | V | H |
| WRITE AUTO COMMAND | L | H | L | H | H | L | N/A | BA 0 | BA 1 | BG 0 | BG 1 | BG 2 |
| | H | C2 | C3 | C4 | C5 | C6 | C7 | C8 | C9 | C10 | V | L |
| WRITE NT | L | H | L | H | H | L | N/A | BA 0 | BA 1 | BG 0 | BG 1 | BG 2 |
| | L | V | V | V | V | V | V | V | V | V | V | V |
| READ COMMAND | L | H | L | H | H | H | N/A | BA 0 | BA 1 | BG 0 | BG 1 | BG 2 |
| | H | C2 | C3 | C4 | C5 | C6 | C7 | C8 | C9 | C10 | V | H |
| READ AUTO RECHARGE | L | H | L | H | H | H | N/A | BA 0 | BA 1 | BG 0 | BG 1 | BG 2 |
| | H | C2 | C3 | C4 | C5 | C6 | C7 | C8 | C9 | C10 | V | L |
| READ NT | L | H | L | H | H | H | N/A | BA 0 | BA 1 | BG 0 | BG 1 | BG 2 |
| | L | V | V | V | V | V | V | V | V | V | V | V |

FIG. 2

SYSTEMS AND METHODS FOR CENTRALIZED ADDRESS CAPTURE CIRCUITRY

BACKGROUND

Field of the Present Disclosure

Embodiments of the present disclosure relate generally to the field of semiconductor devices. More specifically, embodiments of the present disclosure relate to centralized command decoder of read and write commands for a memory device.

Description of Related Art

Semiconductor devices (e.g., memory devices) utilize timings with shifts of data signals, data strobes, commands, and/or other signals to perform operations. The commands are decoded and captured using command address bits. Some memory devices utilize two-cycle commands, like Write (WR), Write Auto Precharge (WRA), Read (RD), and Read Auto Precharge (RDA) commands, using common address bits that are to be captured in the first cycle and/or the second cycle based on the decoded commands. Some memory devices utilize separate decoders for each command that may utilize excess circuitry, have excess cost, and/or have an excess size for the memory devices.

Embodiments of the present disclosure may be directed to one or more of the problems set forth above.

BRIEF DESCRIPTION OF DRAWINGS

FIG. 2 is a table of encoded commands with a common bit pattern between the commands, according to an embodiment of the present disclosure.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously noted, some memory devices utilize separate decoders for each command, increasing pipeline circuitry, cost, and size of the memory device. To alleviate the necessity of this additional pipeline circuitry, some memory devices may collapse some circuitry (e.g., command decoders) to decode a single result from common bit patterns that are common between a number of commands to flag that one of the number of commands has been received. In other words, any number of commands share a pattern in all but one (or more) command address bit(s). The decoder determines that one of the number of commands has been received and captures the common command bits in a second cycle. The remaining bit(s) (e.g., CA<4>) that differ between the number of commands may also be captured and used to differentiate between the number of commands downstream for the second cycle bits. For instance, circuitry that may typically receive only a decoded command in embodiments with a decoder for each command type may instead receive a decoded signal indicating that one of the commands corresponding to the command decoder has been received. The circuitry may receive the one or more bits and combine those bits with the decoded signal. For instance, if the circuitry corresponds to a 0 and 1 in bits transported downstream, the circuitry may use an inverter to invert the 0 and use an AND gate to combine the decoded signal, the inverted 0 bit (i.e., 1), and the 1 bit to output a signal that is logically equivalent to an individually decoded command.

Figure 1:
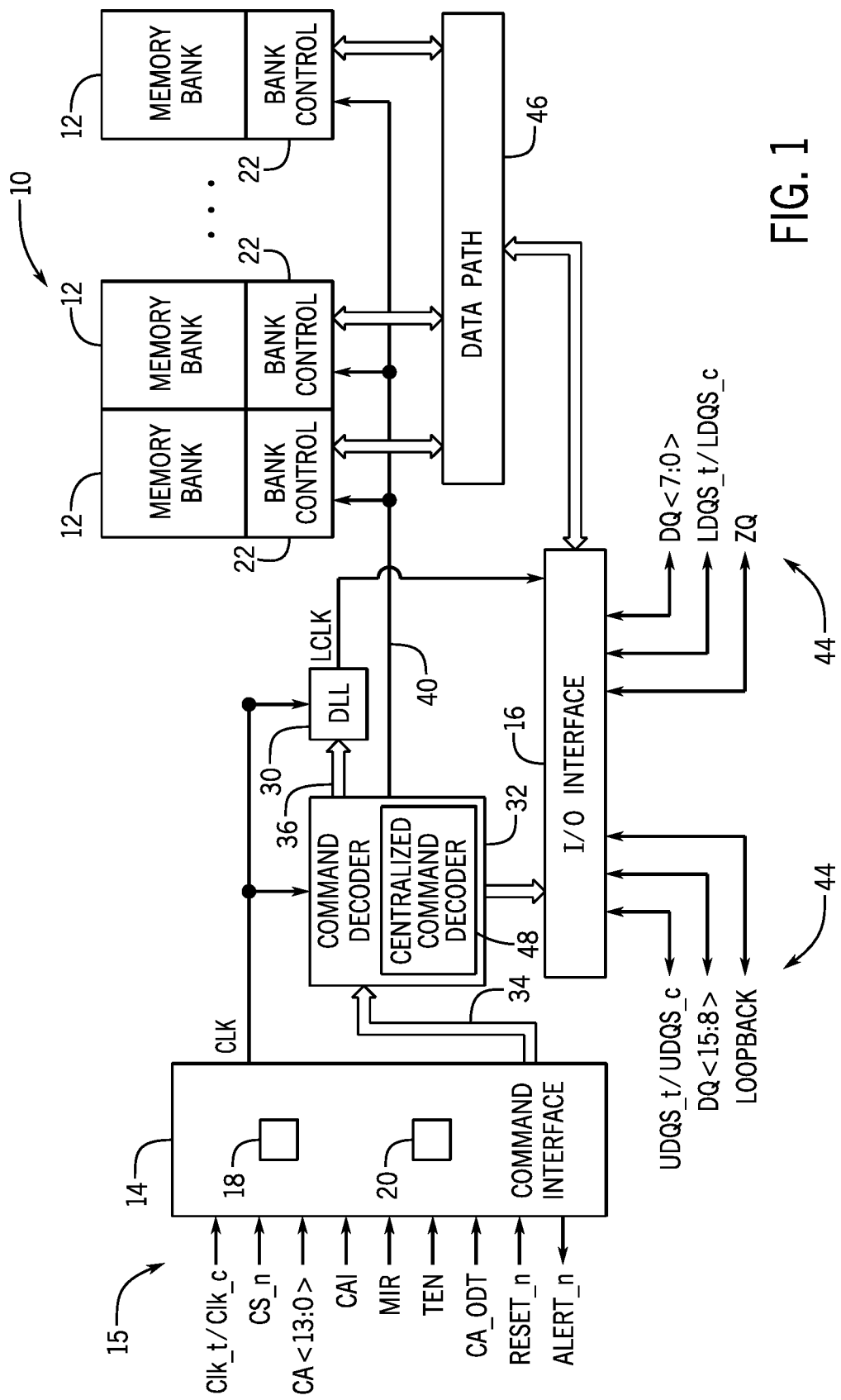
FIG. 1 is a simplified block diagram illustrating certain features of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x4, x8, or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t/) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands. As previously discussed, the command decoder 32 may include at least one centralized command decoder 48 that decodes multiple commands (e.g., WR, RD, WRA, RDA) using common command address bits to reduce pipeline redundancy when using 2-cycle commands.

In addition, the command interface 14 may be configured to receive a number of other command signals. For instance, a command/address on die termination (CA_ODT) signal may be provided to facilitate proper impedance matching within the memory device 10. A reset command (RESET n) may be used to reset the command interface 14, status registers, state machines and the like, during power-up for instance. The command interface 14 may also receive a command/address invert (CAI) signal which may be provided to invert the state of command/address signals CA<13:0> on the command/address bus. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the TO interface 16. More specifically, the data may be sent to or retrieved from the memory banks 12 over the data path 46, which includes a plurality of bi-directional data buses. Data TO signals, generally referred to as DQ signals, are generally transmitted and received in one or more bi-directional data busses. For certain memory devices, such as a DDR5 SDRAM memory device, the TO signals may be divided into upper and lower bytes. For instance, for a x16 memory device, the TO signals may be divided into upper and lower TO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_c), the data strobe (DQS) signals may be provided as a differential pair of data strobe signals (DQS_t/ and DQS_c) to provide differential pair signaling during reads and writes. For certain memory devices, such as a DDR5 SDRAM memory device, the differential pairs of DQS signals may be divided into upper and lower data strobe signals (e.g., UDQS_t/ and UDQS_c; LDQS_t/ and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

As previously discussed, the centralized command decoder 48 may be used to decode whether any of a group of commands have been received. For instance, the group of commands may include any commands that utilize a second cycle to capture command address bits. For instance, the commands may include at least those commands that receive an address or options in some bits (e.g., at least some of CA<13:5>) to indicate that such bits should be captured. With the foregoing in mind, FIG. 2 shows a table 50 with six commands 52, 54, 56, 58, 60, 62 that share common bits 64 captured in the first cycle. Decoding any of these commands 52, 54, 56, 58, 60, 62 indicate that additional bits (e.g., any of the bits of CA<13:0>) are to be captured from the command address bus. For example, additional bits (e.g., CA<10:6> or CA<10:5>) are captured from the command address bus during a first cycle (e.g., when chip select signal (CS_n) is low). Additionally or alternatively, any of the bits (e.g., CA<13:0>) are captured from the command address bus during a second cycle. Accordingly, a single centralized command decoder may be used to quickly determine whether the bits are to be captured from the command address bus for any of the commands in the second cycle of the Clk_t of FIG. 1. For example, a latch may capture the command address bits based on decoding any of the commands 52, 54, 56, 58, 60, 62 and/or a chip select signal (CS_n).

As shown in table 50, CS_n may be high for the second cycle of the commands 52, 54, 58, 60 and may be low for the second cycle of the commands 56, 62. The low value of CS_n in the second cycle indicates that no additional bits are to be captured from the command address bus corresponding to commands 56, 62. A first set of commands (e.g., commands 52, 54, 56) may differ from a second set of commands (e.g., 58, 60, 62) at a single bit (e.g., bit 66). In certain embodiments, the first set of commands may be a set of write commands (e.g., a write command type) and the second set of commands may be a set of read commands (e.g., a read command type). For example, the command 52 may be a write command, the command 54 may be a write auto precharge command, and the command 56 may be a write non-target (NT) command, a read command, a read auto precharge command, or a read NT command. In some embodiments, fewer commands, more commands, or different commands may be centralized into the centralized command decoder 48 as long as some bits are common to the centralized commands. In some embodiments, the number of different bits (e.g., bit 66) may be more than a single bit, such as 2 or 3 bits. Additionally, to maintain separation between the commands, the bit(s) (e.g., bit 66) may be sent downstream to distinguish the commands 52, 54, 56, 58, 60, 62 from each other later in the pipeline where the single decoded signal from the centralized command decoder 48 is logically combined with the bit(s) transported downstream to downstream circuitry. For instance, if the downstream circuitry corresponds to a command with a H value and a L value in the bits transported downstream, the circuitry may use an inverter to invert the bit to correspond to the L value and use an AND gate to combine the decoded signal, the inverted bit (i.e., previously L), and the H bit to output a signal that is logically equivalent to an individually decoded command corresponding to the command.

Figure 3:
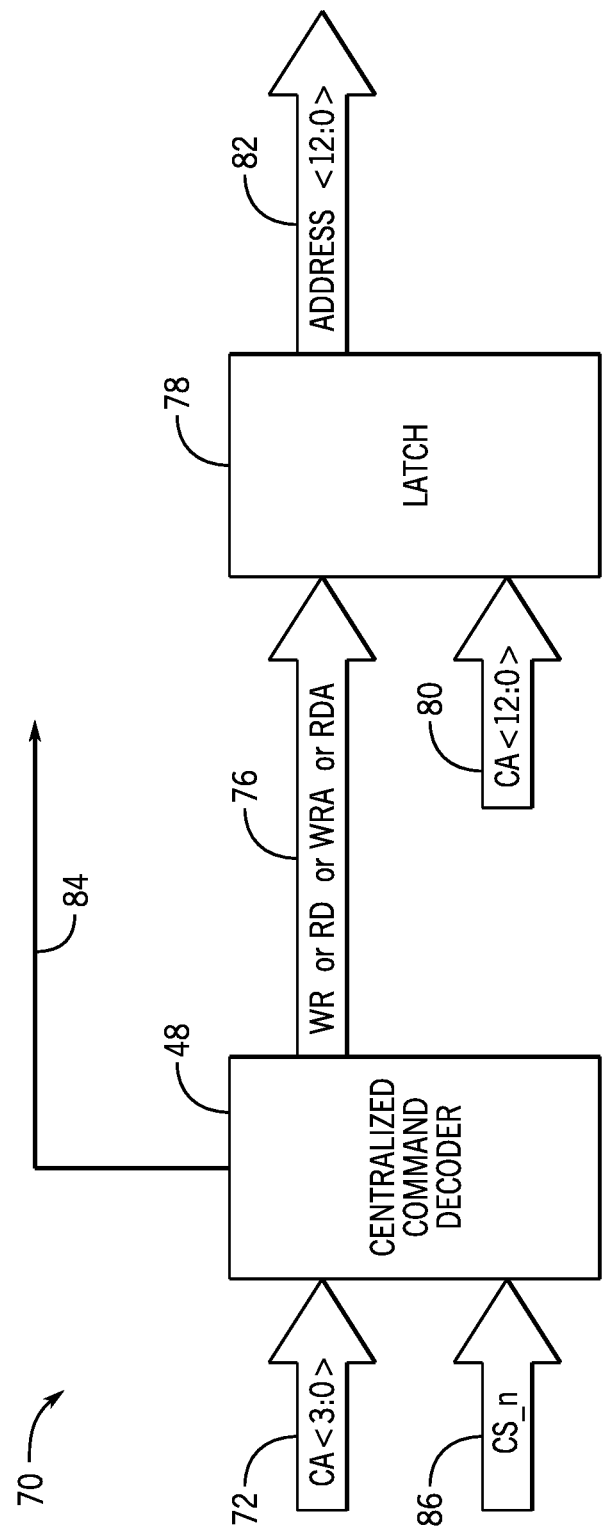
FIG. 3 is a block diagram of circuitry used to decode and capture the common bit pattern using a centralized command decoder, according to an embodiment of the present disclosure.

FIG. 3 is a block diagram 70 of circuitry used to decode and capture the command address bits using a centralized command decoder. A centralized command decoder 48 receives a first portion 72 (e.g., 4 of 13) of bits of the CA bits. The centralized command decoder 48 decodes that the first portion of the incoming command (e.g., WR, RD, WRA, RDA commands) matches a pattern (e.g., HLHH in respective bits of the portion). For instance, all but a number (e.g., 1, 2, 3, or more) of the incoming command bits (e.g., bit 66) match a specific bit pattern. The bit pattern may include additional bits and/or signals. For instance, the centralized command decoder 48 may receive the CS_n 86 to determine whether a latch signal 76 or decoded signal is to be asserted. When the bit pattern is detected, the centralized command decoder 48 indicates that the incoming command is one of the commands corresponding to the pattern. Furthermore, since the commands corresponding to the pattern indicate that additional bits are to be captured from the command bus, the centralized command decoder 48 outputs a latch signal 76 that causes a latch 78 to capture bits (e.g., CA<12:0> or CA<13:0>) 80 in a subsequent (e.g., second) clock cycle.

The most recent value latched in the latch 78 is output as output column address bits 82. However, since the latch signal 76 output from the centralized command decoder 48 is generic to at least two commands, distinguishing bit(s) 84 may be sent downstream via a transmission line or transmission path to distinguish the commands when their resulting operations are to be performed. In some embodiments, the centralized command decoder 48 may drive the distinguishing bit(s) 84 based on received values when the latch signal 76 is asserted. Otherwise, the centralized command decoder 48 may hold their outputs at some predetermined value that indicates that no output is transmitted. Alternatively, the distinguishing bit(s) 84 may be driven with a logic gate used to gate its output by ORing the distinguishing bit(s) 84 with the latch signal 76 and ORing the results of the OR gate as a transmitted OR output. Although the distinguishing bit(s) 84 are shown as transmitted from the centralized command decoder 48, other embodiments of the memory device 10 may derive the distinguishing bit(s) 84 from other locations in the pipeline. For instance, the distinguishing bit(s) 84 may be hardwired to respective bits of the incoming portion 72 that may differ in commands corresponding to the centralized command decoder 48.

Figure 4:
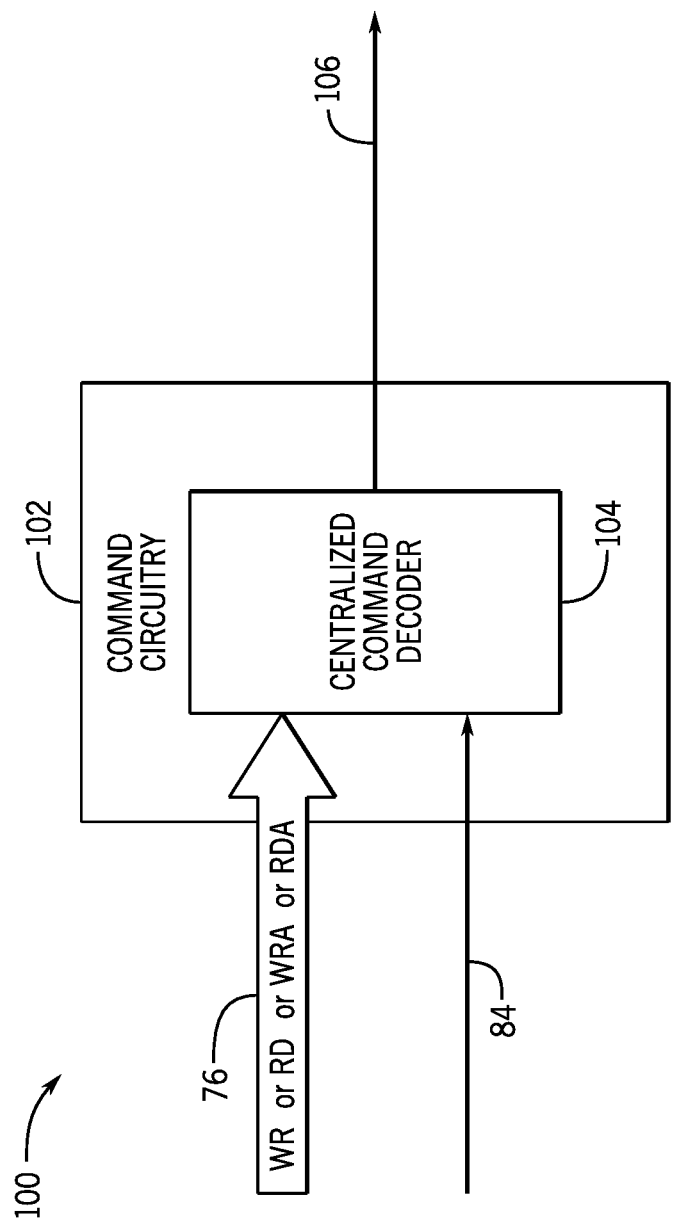
FIG. 4 is a block diagram of circuitry used to combine decoded signals with corresponding distinguishing bit(s) to form a corresponding decoded command using combination circuitry, according to an embodiment of the present disclosure.

FIG. 4 is a block diagram 100 of circuitry used to combine decoded signals with corresponding distinguishing bit(s) to form a corresponding decoded command using combination circuitry. Command circuitry 102 may include combination circuitry 104 and may receive a decoded command and output a command signal 106. For example, the combination circuitry 104 receives a decoded signal (e.g., latch signal 76) output from the centralized command decoder 48 and the distinguishing bit(s) 84 from the centralized command decoder 48. The combination circuitry 104 may combine the latch signal 76 and the distinguishing bit(s) 84 and output the command signal 106 that is logically equivalent to the decoded command associated with the latch signal 76 and/or the distinguishing bit(s) 84. For example, the command signal 106 output by the combination circuitry 104 may correspond to a write command, a write auto precharge command, a write NT command, a read command, a read auto precharge command, or a read NT command. In certain embodiments, fewer commands, more commands, or different commands may be output by the combination circuitry 104 and/or the command circuitry 102. In some embodiments, the combination circuitry 104 may include any number of logic gates (e.g., AND gate, NAND gate) and/or any number of inverters. For instance, if the command circuitry 102 corresponds to a command with a H value and a L value in the distinguishing bit(s) 84, the combination circuitry 104 may use an inverter to invert the bit corresponding to the L value and use an AND gate to combine the latch signal 76, the inverted bit, and the bit corresponding to the H value to output the command signal 106.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
    a command interface configured to receive a command from a host device via a plurality of command address bits; and
    a centralized command decoder configured to:
        receive the command;
        determine whether the command matches a bit pattern corresponding to a plurality of command types, wherein the plurality of command types comprises a write command and a read command; and
        in response to the command matching the bit pattern:
            asserting a latch signal; and
            transmitting at least one bit of the command not in the bit pattern; and
    combination circuitry configured to output a command signal based on the latch signal and the at least one bit of the command.

2. The memory device of claim 1, comprising a latch configured to capture the plurality of command address bits, wherein the latch is configured to capture the plurality of command address bits in a subsequent cycle of a system clock after a cycle of the system clock used to receive the command.

3. The memory device of claim 1, wherein the plurality of command types comprises a write auto precharge command and a read auto precharge command, and the command is the write command.

4. The memory device of claim 1, wherein the plurality of command types comprises a write auto precharge command and a read auto precharge command, and the command is the read command.

5. The memory device of claim 1, wherein the plurality of command types comprises a write auto precharge command and a read auto precharge command, and the command is the write auto precharge command.

6. The memory device of claim 1, wherein the plurality of command types comprises a write auto precharge command and a read auto precharge command, and the command is the read auto precharge command.

7. The memory device of claim 1, comprising a transmission path configured to transmit the at least one bit of the command not in the bit pattern down a pipeline to enable the memory device to distinguish between the plurality of command types.

8. The memory device of claim 7, wherein the bit differs between the read command and the write command.

9. A memory device, comprising:
    a command interface configured to receive a command from a host device via a plurality of command address bits; and
    a centralized command decoder configured to:
        receive the command;
        determine whether the command matches a bit pattern corresponding to a first command type and a second command type; and
        in response to the command matching the bit pattern, asserting a latch signal; and
    combination circuitry configured to combine the latch signal and a bit of the command not in the bit pattern and configured to output a command signal corresponding to the command.

10. The memory device of claim 9, comprising a latch configured to capture the plurality of command address bits based at least in part on assertion of the latch signal, wherein the latch is configured to capture the plurality of command address bits in a subsequent cycle of a system clock after a cycle of the system clock used to receive the command.

11. The memory device of claim 9, wherein the first command type is a read command type.

12. The memory device of claim 11, wherein the first command type comprises read and read auto precharge commands.

13. The memory device of claim 9, wherein the second command type is a write command type.

14. The memory device of claim 13, wherein the second command type comprises write and write auto precharge commands.

15. The memory device of claim 13, comprising a transmission line configured to transmit the bit of the command that is not in the bit pattern, wherein the bit is different between the first command type and the second command type.

16. A method of capturing bits in a memory device, comprising:
    receiving a plurality of command address bits corresponding to a command at the memory device;
    decoding a subset of the plurality of command address bits in a command decoder to determine whether the command contains to a bit pattern corresponding to a set of commands; and
    based at least in part on a determination that the command corresponds to the bit pattern:
        transmitting a latch signal from the command decoder to a latch configured to capture at least some of the plurality of command address bits based on the latch signal; and
        transmitting a bit of the command from the command decoder to combination circuitry, wherein the bit is different between at least two of the set of commands; and
        generating a command signal in the combination circuitry based on the latch signal and the bit of the command.

17. The method of claim 16, wherein the set of commands comprises a write command and a write auto precharge command.

18. The method of claim 16, wherein the set of commands comprises a read command and a read auto precharge command.

19. The method of claim 16, wherein the command signal corresponds to the command and not the whole set of commands.

20. The method of claim 16, wherein receiving the plurality of command address bits comprises capturing a first part of the plurality of command address bits in a cycle of a system clock and capturing a second part of the plurality of command address bits in a subsequent cycle of the system clock after the cycle of the system clock.

* * * * *